United States Patent [19]
Vaisanen

[11] Patent Number: 5,230,091
[45] Date of Patent: Jul. 20, 1993

[54] METHOD AND APPARATUS FOR TUNING AND COMPENSATING POWER LEVELS IN A RADIO TELEPHONE

[75] Inventor: Risto Vaisanen, Salo, Finland

[73] Assignee: Nokia Mobile Phones Ltd., Salo, Finland

[21] Appl. No.: 583,942

[22] Filed: Sep. 17, 1990

[30] Foreign Application Priority Data

Sep. 25, 1989 [FI] Finland .................................. 894529

[51] Int. Cl.$^5$ .............................................. H04B 17/00
[52] U.S. Cl. ..................................... 455/88; 455/67.4; 455/92; 455/115; 455/126
[58] Field of Search ................. 455/92, 115, 117, 125, 455/126, 127, 67.1, 67.4, 226.2, 226.3, 88

[56] References Cited

U.S. PATENT DOCUMENTS

| | | | |
|---|---|---|---|
| 4,613,990 | 9/1986 | Halpern | 455/33.2 |
| 4,870,699 | 9/1989 | Garner et al. | 455/125 |
| 4,903,327 | 2/1990 | Raghuram et al. | 455/127 |
| 5,034,697 | 7/1991 | Johnson | 455/127 |
| 5,091,919 | 2/1992 | Kuisma | 455/126 |

*Primary Examiner*—Reinhard J. Eisenzopf
*Assistant Examiner*—Edward Urban
*Attorney, Agent, or Firm*—Darby & Darby

[57] ABSTRACT

In a method and apparatus according to the invention the tuning information determined by a measuring computer (20) is stored in the memory of the radio telephone (1). When the radio telephone is in operation the microprocessor (10) receives from the sensors (14) information e.g. about the temperature, and it selects from its memory tuning information, with which the transmitter (11) power is controlled via a D/A-converter (15). The tuning can be made automatically, without opening the casing of the radio telephone.

7 Claims, 1 Drawing Sheet

METHOD AND APPARATUS FOR TUNING AND COMPENSATING POWER LEVELS IN A RADIO TELEPHONE

BACKGROUND OF THE INVENTION

The invention relates to a method of tuning and compensating power levels in a radio telephone having a logic section which controls the operation, and to the use of this method in series production and maintenance. The invention also relates to a radio telephone, which is tuned with a method according to the invention.

Generally the power levels in a radio telephone are tuned by adjusting built-in trimmer potentiometers and monitoring the output power of the radio telephone. The tuning is generally made manually, although in some cases a tuning with the aid of robots could be possible. It is however common to these prior art methods to adjust electromechanical components, such as trimmer potentiometers, with the aid of tools.

The power of the transmitter may vary with the operating conditions of the radio telephone. The operating conditions are influenced by the selected channel frequency, the radio telephone's internal temperature and the supply voltage (accumulator or battery voltage). In prior art it is generally tried to compensate for the power variations with means of analog technology. Diodes or NTC resistors are used to compensate for power variations due to temperature changes, for example. The transmitter output power of individual radio telephone units can behave in very different ways at various temperatures and with various voltages, and thus the compensating circuitry designed for a radio telephone type does not necessarily function in a desired manner for every unit in series production.

The known methods entail many problems and drawbacks. The trimmer potentiometers, being electromechanical components, are less reliable than the electronic components used in the radio telephone and they take up a substantial area on the device's circuit board. The need for a large space is a problem, particularly concerning handsets. In addition, tuning of the trimmers is slow and requires a skilled person performing the tuning. The tuning precision depends on the person, and thus human errors are possible. The radio telephone casing has to be opened for the tuning in order to get access to the various components.

The power levels are usually compensated for temperature and battery voltage variations by analog techniques, so that the accuracy of the compensation depends on component tolerances, and a fully individual compensation will not be possible in series production.

The object of the invention is to devise a method, with which the above mentioned prior art problems and drawbacks are obviated. The solution to the problem is achieved in accordance with my invention wherein external tuning equipment is connected to the radio telephone's antenna interface and at least one auxiliary interface. The tuning equipment measures the power level delivered by the transmitter to the antenna interface and this power level is adjusted until the desired power level is achieved. In accordance with an aspect of my invention, the individual tuning results are then stored as compensating values in a non-volatile memory in the radio telephone whereby in operation the transmitter's power level is controlled according to these stored tuning results.

In the invention it is essential to store individual tuning results for chosen operating conditions into the radio telephone's memory as compensating values. Specifically in one embodiment of my invention the transmitter's respective power level is controlled in accordance to the tuning results by the logic section via a D/A-converter when the radio telephone is in operation. Preferably the tuning is made by connecting the tuning equipment to the normal external connections of the radio telephone, the tuning being made without opening the radio telephone casing.

This tuning arrangement may be applied to the final testing in series production of radio telephones, and to the maintenance of radio telephones.

The radio telephone according to the invention includes sensors connected to the logic section and detecting the radio telephone's operating conditions, and between the logic section and the transmitter a D/A-converter is arranged, which converts data corrected with compensating constants and output by the logic section into a voltage controlling the transmitter power.

BRIEF DESCRIPTION OF THE DRAWINGS

The invention is described in greater detail below by way of an example with reference to the accompanying drawing, in which the only FIGURE is a simplified block diagram illustrating the tuning arrangement according to the invention.

The tuning equipment 2 is connected to the radio telephone's 1 antenna interface 31 and auxiliary equipment interface 32 including the low frequency interface 33. The test signal selected for the tuning (e.g. a constant microphone voltage or sound pressure to the microphone) is connected from the measuring device 21 of the tuning equipment 2 to the low frequency interface 33 of the radio telephone. The measuring computer 20 of the tuning equipment is connected to the logic section 10 through the auxiliary interface 32. The measuring computer 20 can via the logic section 10 control the radio telephone to select a desired channel (radio frequency). Through the logic section 10 it can also control the A/D-converter 15, whose output voltage is used to control the output power of the transmitter 11. The transmitter output power is connected to the antenna interface 31, e.g. through a duplex filter 13, and it will be measured with measuring devices 21 which may, for example, comprise a power level meter), the measuring results of which are transmitted on an internal bus 22 to the measuring computer 20. The radio telephone receiver 12 is also connected to the antenna interface 31.

Figure 1:
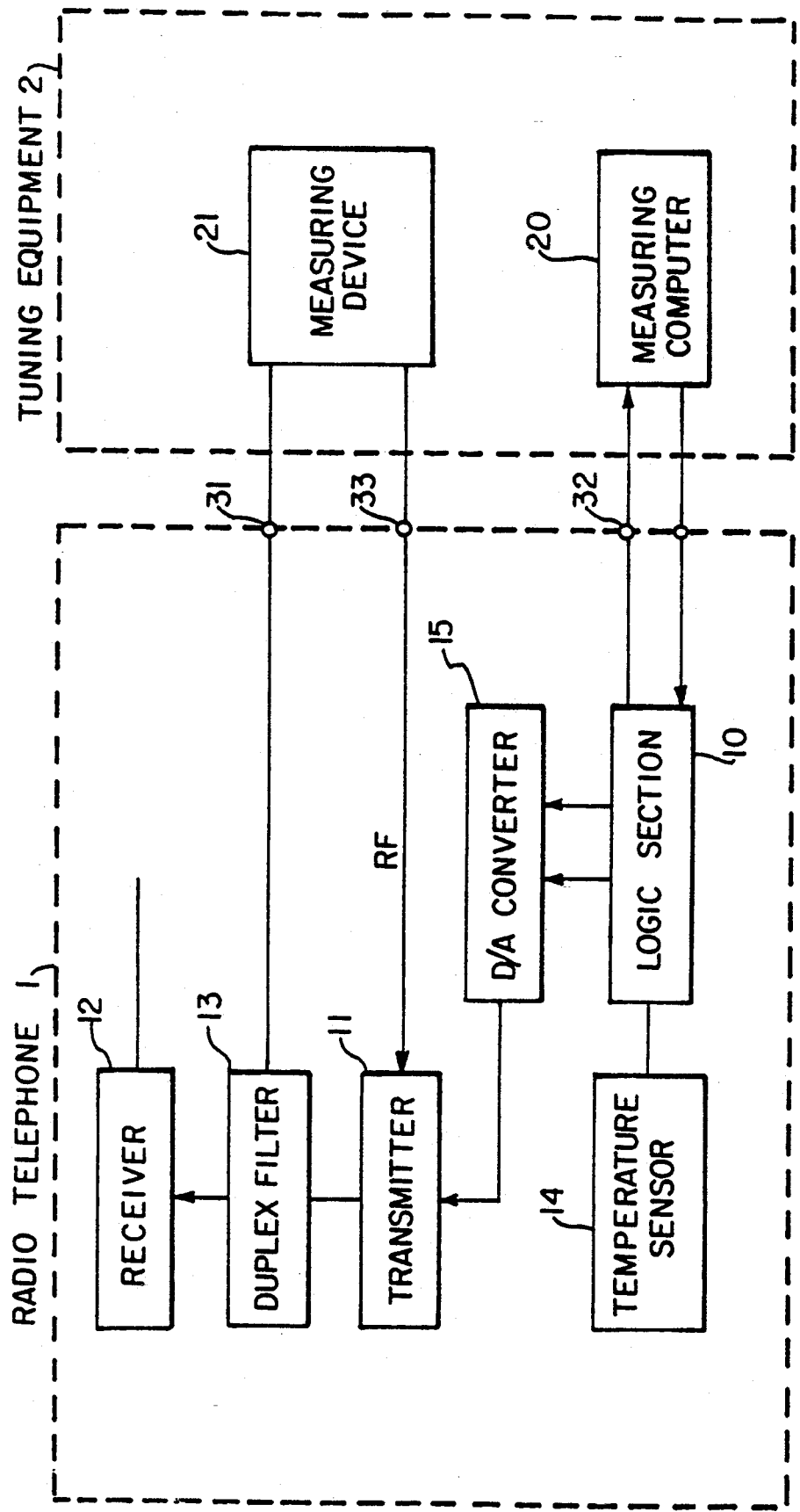

The radio telephone also includes a temperature sensor 14 to detect the internal temperature of the radio telephone.

The logic section 10 advantageously also includes a microprocessor, memories—especially a non-volatile memory to store programs and compensating data—and an A/D-converter, with which the operating temperature of the batteries or accumulators and the voltage from the temperature sensor 14 is converted into a digital format which can be used by the microprocessor. During tuning the microprocessor is connected to the measuring computer 20 via the auxiliary equipment interface 32, through which information is transferred in both directions, e.g. information about the temperature measured by the sensor 14 to the measuring computer and set values from the measuring computer to the microprocessor.

The operating channel (or channel range), the temperature (or temperature range) measured with the sensor 14, and the operating voltage (or the operating voltage range) measured with the D/A-converter constitute the operating conditions of the radio telephone.

The tuning of the radio telephone according to the invention is carried out in the following manner. The tuning is initially made at room temperature, on the middle channel and with nominal operating voltage. The radio telephone is placed in a climate chamber (cold/hot chamber), and the measuring devices 21 are connected to the antenna interface 31 and the low frequency interface 33.

1) As the first set value to the microprocessor 10 the measuring computer 20 places (in series production) the long-time means value of the set values of previous telephones, for the corresponding operating condition.

2) The measuring computer 20 reads the antenna interface 31 power level measured by the measuring device 21.

3) The memory of the measuring computer contains information about the power level target value, with which the measured value is compared. According to the comparison result the need for a set value change is calculated (calculated by the measuring computer in automatic tuning) and a new set value is transmitted to the microprocessor 10 via the auxiliary equipment interface.

4) The microprocessor 10 controls the output voltage of the D/A-converter 15, and thus the output power of the transmitter, in a desired direction.

5) The power level of the antenna interface is measured again, the measurement result is transferred to the computer 20, the result is compared with the desired value, and a new set value for the radio telephone is calculated.

The steps 2) to 5) are repeated until the desired power level target value is achieved with a selected, sufficient precision. The tuning result, or the obtained set value for the selected operating condition to provide the desired target level, is stored as a compensating value in the non-volatile memory of the microprocessor 10.

6) In the next step the tuning is performed for the highest channel (the upper channel range) and for the lowest channel (the lower channel range) and for the highest and the lowest operating voltages, repeating the steps 1) to 5).

When the tuning at room temperature is completed, the steps 1) to 6) are repeated at extreme temperatures (the higher temperature range, the lower temperature range).

It should be noted that the tuning may also be carried out with operating conditions in an order differing from the above order, depending of the available climate chamber arrangement and other productions reasons. The number of operating conditions to be tuned may be chosen to suit the production and the operation of the radio telephone. The number of the operating conditions can be reduced in a convenient way by using e.g. only one tuning point representing a middle range, a higher range and a lower range, respectively, for each variable (channel, temperature, operating voltage). For example, in practice the ranges could be:

a middle channel representing a middle range, the highest and the lowest channel representing the higher and the lower ranges; and correspondingly room temperature (e.g. 25° C. for the range +5° ... +45° C.), the highest (e.g. +55° C. for the range +45° ... +85° C.) and the lowest temperature (e.g. −10° C. for the range −25° ... +5° C.); and the nominal value, the minimum value and the maximum value of the operating voltage.

In extreme operating conditions it will be tried to use the same compensating values as in "normal conditions", but if the power level deviates more than a certain amount from the desired value, the tuning is made for the respective operating conditions.

In the production the tuning can be made in the final testing, when the radio telephone is otherwise completely ready. The tuning can now be made without opening the telephone's casing. Furthermore, by suitable programming of the steps 1) to 6) in the measuring computer, the tuning can be made completely automatically, whereby the results of the tuning will become more reliable (no human errors), and individually for each radio telephone. Due to the automatization the testing throughput time and the amount of required personnel will be reduced. From a production management standpoint the inventive method signifies a great advantage, when for example the production is transferred to another plant, because the automatic tuning program does not require much training of personnel for the tuning tasks, as all information required in the tuning can be incorporated in the tuning programs of the measuring computer.

The tuning method according to the invention can also conveniently be used in the maintenance of radio telephones, whereby the tuning equipment may be replaced by simpler service equipment, with which e.g. the tuning of the radio telephone is checked, and/or the tuning is made only at room temperature.

In a radio telephone realizing the method according to the invention the range of the operating conditions is measured during operation with a sensor 14 and A/D-converters (not shown). In accordance with the operating conditions the microprocessor 10 selects from its non-volatile memory a compensating constant or value tuned for the respective operating conditions, and the transmitter power level is set according to this value.

The objects mentioned in the introduction will be met with a radio telephone according to the invention, because no trimmer potentiometers are required, whereby the reliability of the radio telephone is increased and the space requirements for the circuit board (boards) will be reduced. No individual tuning points (connectors, pins, etc.) are now needed on the circuit boards, which further reduces the space requirement. Tuning steps of separate modules are not needed either, because the tuning is made with an assembled radio telephone, utilizing its normal interfaces.

The invention can be applied to different types of analog and digital radio telephones, cellular radio telephones, portable and mobile radio telephones.

I claim:

1. A method useful for tuning power levels in a radio telephone having a transmitter and a logic section which controls operation, the method comprising the steps of:

supplying a power level from the transmitter to an antenna interface;

sensing the power level with an external tuning sensor connected to the antenna interface and through an auxiliary interface to the logic section;

adjusting the power level in a feed-back loop via the logic section based on the sensed power level until a desired tuning result is achieved;

storing the desired tuning result for the radio telephone as a compensating value in a non-volatile memory within the logic section; and controlling a power level of the transmitter via a digital analog converter according to the desired tuning result stored in the logic section when the radio telephone is operating.

2. A method as in claim 1, further comprising the step of repeating the steps of supplying, sensing, adjusting and storing for respective power levels which differ from each other in magnitude so as to store respective desired tuning results in the logic section each being associated with an associated one of the respective power levels, the step of controlling taking place for controlling the respective power levels of the transmitter according to the respective desired tuning results when the radio telephone is operating.

3. A method as in claim 2, further comprising the step of providing to the logic section a first set value as a long-time mean value of the set values corresponding to the tuning results.

4. A method as in claim 1, further comprising the step of storing target values of the power level to be controlled and tuning the power level to be controlled in accordance with the target values.

5. A method as in claim 1, wherein the steps of supplying, sensing, adjusting and storing are performed for selected operating conditions of the radio telephone with respect to different channel ranges and different operating temperature ranges so that the compensating values which are stored include those which arise based on the different channel ranges and at the different operating temperature ranges.

6. An apparatus useful for tuning power levels in a radio telephone having a transmitter and a logic section which controls operation, comprising:

means for supplying a power level from the transmitter to an antenna interface;

means for sensing the power level with an external tuning sensor connected to the antenna interface and through an auxiliary interface to the logic section;

means for adjusting the power level in a feed-back loop via the logic section based on the sensed power level until a desired tuning result is achieved;

means for storing the desired tuning result for the radio telephone as a compensating value in a non-volatile memory within the logic section; and means for controlling a power level of the transmitter via a digital analog converter according to the desired tuning result stored in the logic section when the radio telephone is operating.

7. An apparatus as in claim 6, further comprising means for storing target values of the power level to be controlled and for tuning the power level to be controlled in accordance with the target values.

* * * * *